United States Patent
Van Den Brink et al.

(10) Patent No.: US 10,401,463 B2
(45) Date of Patent: Sep. 3, 2019

(54) BREATH-HOLD DETECTION FOR MAGNETIC RESONANCE IMAGING

(71) Applicant: KONINKLIJKE PHILIPS N.V., Eindhoven (NL)

(72) Inventors: Johan Samuel Van Den Brink, Eindhoven (NL); Gabriele Marianne Beck, Eindhoven (NL)

(73) Assignee: KONINKLIJKE PHILIPS N.V., Eindhoven (NL)

(*) Notice: Subject to any disclaimer, the term of this patent is extended or adjusted under 35 U.S.C. 154(b) by 314 days.

(21) Appl. No.: 15/105,297

(22) PCT Filed: Dec. 20, 2014

(86) PCT No.: PCT/EP2014/078935
§ 371 (c)(1),
(2) Date: Jun. 16, 2016

(87) PCT Pub. No.: WO2015/092062
PCT Pub. Date: Jun. 25, 2015

(65) Prior Publication Data
US 2016/0313429 A1    Oct. 27, 2016

Related U.S. Application Data

(63) Continuation of application No. 14/479,285, filed on Sep. 6, 2014, now Pat. No. 10,065,403, which is a
(Continued)

(30) Foreign Application Priority Data
Dec. 20, 2013    (EP) ..................................... 13198693

(51) Int. Cl.
*G01R 33/567*    (2006.01)
*G01R 33/48*    (2006.01)
(Continued)

(52) U.S. Cl.
CPC ....... *G01R 33/5676* (2013.01); *G01R 33/283* (2013.01); *G01R 33/4818* (2013.01); *G01R 33/56509* (2013.01); *G01R 33/4826* (2013.01)

(58) Field of Classification Search
CPC ............ G01R 33/5676; G01R 33/4818; G01R 33/283; G01R 33/56509; G01R 33/4826
See application file for complete search history.

(56) References Cited

U.S. PATENT DOCUMENTS

| 4,878,499 A | 11/1989 | Suzuki et al. |
| 5,363,844 A | 11/1994 | Riederer et al. |

(Continued)

FOREIGN PATENT DOCUMENTS

JP    2007029250 A    2/2007

OTHER PUBLICATIONS

Gdaniec et al "Robust Abdominal Imaging With Imcomplete Breath-Holds" Magnetic Resonance in Medicine vol. 71, No. 5 p. 1733-1742.
(Continued)

*Primary Examiner* — Dixomara Vargas
*Assistant Examiner* — Zannatul Ferdous

(57) ABSTRACT

Magnetic resonance (MR) imaging of an area (144) of a subject of interest (120) includes issuing a breath-hold command to the subject of interest (120), performing motion detection of the subject of interest (120) to detect a breath-hold condition in the area (144) of the subject of interest (120), upon detection of the breath-hold condition in the area (144) of the subject of interest (120), performing k-space (154) sampling of the area (144) of the subject of interest (120) with a given resolution, processing the k-space (154) samples covering the area (144) of the subject of interest (120) to obtain a MR image of the area (144) of the subject of interest (120).

20 Claims, 5 Drawing Sheets

Related U.S. Application Data continuation-in-part of application No. PCT/US2013/033610, filed on Mar. 22, 2013, which is a continuation-in-part of application No. PCT/US2013/030056, filed on Mar. 8, 2013, said application No. 14/479,285 is a continuation-in-part of application No. 13/511,593, filed on Sep. 24, 2012, now Pat. No. 9,229,001.

(60) Provisional application No. 61/754,377, filed on Jan. 18, 2013.

(51) Int. Cl.
*G01R 33/28* (2006.01)
*G01R 33/565* (2006.01)

(56) References Cited

U.S. PATENT DOCUMENTS

| | | | |
|---|---|---|---|
| 5,746,208 A | 5/1998 | Prince | |
| 5,830,143 A | 11/1998 | Mistretta | |
| 6,144,874 A | 11/2000 | Du | |
| 8,200,311 B2 | 6/2012 | Spincemaille | |
| 2004/0059213 A1* | 3/2004 | Kassai | A61B 5/055 600/410 |
| 2010/0264925 A1* | 10/2010 | Stemmer | G01R 33/56375 324/309 |
| 2011/0181286 A1* | 7/2011 | Kamada | A61B 5/055 324/309 |
| 2012/0243756 A1 | 9/2012 | Samsonov | |
| 2015/0073263 A1* | 3/2015 | Gdaniec | G01R 33/4818 600/413 |

OTHER PUBLICATIONS

Henningsson M et al: "High throughput cardiac MRI using interleaved breath-hold cardiac cine and free-breathing coronary MR angiography: Initial results", Proceedings of the International Society for Magnetic Resonance in Medicine, ISMRM, 21st Annual Meeting and Exhibition, Salt Lake City, Utah, USA, Apr. 20-26, 2013, Apr. 7, 2013 (Apr. 7, 2013), p. 4568.

Michael E Huber et al: "Single breath-hold extended free-breathing navigator-gated three-dimensional coronary MRA",Journal of Magnetic Resonance Imaging, Society for Magnetic Resonance Imaging, Oak Brook, IL, US, vol. 15, No. 2,Feb. 1, 2002 (Feb. 1, 2002), pp. 210-214.

Jeffrey H. Maki et al: "The Effects of Incomplete Breath-Holding on 3D MR Image Quality", Journal of Magnetic Resonance Imaging, vol. 7, Jan. 1, 1997 (Jan. 1, 1997), pp. 1132-1139.

Seunghoon Nam et al: "Compressed sensing reconstruction for undersampled breath-hold radial cine imaging with auxiliary free-breathing data",Journal of Magnetic Resonance Imaging, vol. 39, No. 1, Jul. 15, 2013 (Jul. 15, 2013), pp. 179-188.

* cited by examiner

BREATH-HOLD DETECTION FOR MAGNETIC RESONANCE IMAGING

CROSS REFERENCE TO RELATED APPLICATIONS

This application is a U.S. national phase application of International Application No. PCT/EP2014/078935, filed on Dec. 20, 2014, which claims the benefit of EP Application Serial No. 13198693.7 filed on Dec. 20, 2013 and is incorporated herein by reference.

FIELD OF THE INVENTION

The invention relates to the field of magnetic resonance imaging.

BACKGROUND OF THE INVENTION

Magnetic resonance imaging (MRI) methods use the interaction between magnetic field and nuclear spins with the purpose of forming two-dimensional or three-dimensional images of a subject of interest, or at least an area thereof. These methods are widely used these days, notably in the field of medical diagnostics, since they do not require ionizing radiation and they are usually not invasive. MRI is used for example as imaging technique to visualize structural abnormalities of the body, e. g. tumor development.

An MRI apparatus uses a powerful magnetic field to align the magnetization of some atomic nuclei in the body, and radio frequency (RF) fields to systematically modify the alignment of this magnetization. This causes the nuclei to produce a rotating magnetic field detectable by a scanner, which constructs an image of the sampled area of the body. Magnetic field gradients cause nuclei at different locations to rotate at different speeds. By using gradients in different directions, 2D images or 3D volumes can be obtained in arbitrary orientation.

MRI in general requires that the subject of interest to be examined is arranged in a strong, uniform magnetic field B0, whose direction at the same time defines an axis, normally the z-axis, of the coordinate system on which the measurement is based. Temporal variations of the magnetization due to the applied RF fields can be detected by means of receiving RF antennas, which are configured and oriented within an examination volume of the MR device in such a manner that the temporal variation of the magnetization is measured in the direction vertically to the z-axis.

Spatial resolution in the body can be realized by switching magnetic field gradients. They extend along the three main axes and are superposed on the uniform magnetic field, leading to a linear spatial dependency of the spin resonance frequency. The signal picked up in the receiving antennas then comprises components of different frequencies which can be linked to different locations in the body/subject.

The signal data obtained by the receiving antennas matches to the spatial frequency domain and are called k-space data. The k-space data generally include multiple lines acquired with different phase encoding steps. Each line is digitized by collecting a number of samples. A set of samples of k-space data is transformed to an MR image, e. g. by inverse Fourier transformation.

Currently, there are two ways to perform MRI scanning, one with breath-hold and the other with free-breathing. In the first option, the subject of interest has to be ordered by an operator of the MRI system to stop breathing for the time of a scan. Free-breathing scans do not require interaction with the subject of interest, but take a longer time than breath-hold scans. Also image quality consistency is a potential issue in free-breathing scans. Hence it is desired to improve scan efficiency while preserving image quality and consistency.

In this context, document U.S. Pat. No. 4,878,499 A refers to a magnetic resonance imaging system. In this system, a static magnetic field is applied to a patient, and a gradient magnetic field and an excitation pulse signal are applied to the patient in accordance with a predetermined pulse sequence, so as to cause a magnetic resonance phenomenon in a selected slice of the patient. The magnetic resonance data of the magnetic resonance phenomenon is acquired, and the magnetic resonance image is obtained from the magnetic resonance data. The system has an announcement section for intermittently urging the patient to stop a body movement. In this system, a data acquisition section is operated under the control of a control section only while the patient stands still in response to the announcement of the announcement section, thereby intermittently acquiring magnetic resonance data in units of a predetermined volume.

Furthermore, document JP 2007 029250 A refers to a magnetic resonance imaging apparatus. A pulse sequence has a body movement detection sequence for detecting the body movement position of a subject and a photographing sequence for acquiring the image of the subject. A control means repeatedly executes the body movement detection sequence, a breathing stop instruction to the subject through a transmission means based on body movement information detected by the body movement detection sequence, the photographing sequence, and the instruction of breathing restart to the subject through the transmission means, also detects the body movement position by continuing the body movement detection sequence even after the breathing stop instruction, and the photographing sequence is executed when the body movement position is within a prescribed range.

Still further, document U.S. Pat. No. 5,363,844 A refers to an NMR system with a respiration monitor. The monitor provides a visual feedback to the patient which enables the patient to perform a series of breath-holds with the patient's diaphragm positioned at the same reference point. This enables NMR data to be acquired over a series of breath-holds without introducing blurring or image artifacts. Between breath-holds a navigator pulse sequence is used to gather NMR data from which diaphragm position is measured, and during each breathhold the pulse sequence is changed to gather NMR image data.

Document U.S. Pat. No. 6,144,874 A refers to a method for NMR image reconstruction. Data required to reconstruct an image is divided into central k-space views and peripheral k-space views. NMR navigator signals are acquired during a scan to indicate patient respiration and a first gating signal is produced when respiration is within a narrow acquisition window and a second gating signal is produced when respiration is within a wider acquisition window. Central k-space views are acquired when the first gating signal is produced and peripheral k-space views are acquired when the second gating signal is produced.

Article "robust abdominal imaging with incomplete breath-holds", Nadine Gdaniec et al., Magnetic resonance in medicine vol. 71, no. 5, pages 1733-1742, ISSN 0740-3194, refers to breath-holding as an established strategy for reducing motion artifacts in abdominal imaging. A sampling pattern is designed to support image reconstruction from undersampled data acquired up to any point in time using compressed sensing and parallel imaging in combination with a navigator-based detection of the onset of respiration. It allows scan termination and thus reconstruction only from consistent data, which suppresses motion artifacts. The spatial resolution is restricted by a lower bound of the sampling density and is increased over the scan, to strike a compromise with the signal-to-noise ratio and undersampling artifacts for any breath hold duration.

SUMMARY OF THE INVENTION

It is an object of the invention to provide a method for magnetic resonance imaging, a software package for upgrading a magnetic resonance imaging system, and a MR imaging system, which enable magnetic resonance imaging with high image quality and few artifacts based on motion of the subject of interest in an efficient manner, in particular to enable high image quality and few artifacts for imaging of the subject of interest in areas undergoing motion due to breathing.

This object is achieved by a method for magnetic resonance (MR) imaging of an area of a subject of interest, comprising the steps of issuing a breath-hold command to the subject of interest, performing motion detection of the subject of interest to detect a breath-hold condition in the area of the subject of interest, performing k-space sampling of the area of the subject of interest to acquire a first subset of k-space samples from the set of k-space samples covering the area of the subject of interest prior to detection of the breath-hold condition in the area of the subject of interest, upon detection of the breath-hold condition in the area of the subject of interest, performing k-space sampling of the area of the subject of interest with a given resolution, comprising performing k-space sampling to acquire a second subset of k-space samples covering the area of the subject of interest, the step of performing motion detection of the subject of interest to detect a breath-hold condition in the area of the subject of interest is performed at least partially during the acquisition of the first and/or second subset of k-space samples, processing the k-space samples covering the area of the subject of interest to obtain a MR image of the area of the subject of interest comprising processing the first and second subset of k-space samples to obtain the MR image of the area of the subject of interest, wherein the first and the second subset of k-space samples together cover the area of the subject of interest with the given resolution, and the step of performing motion detection of the subject of interest to detect a breath-hold condition in the area of the subject of interest is performed at least partially during the acquisition of the first and/or second subset of k-space samples, wherein the step of processing the k-space samples covering the area of the subject of interest to obtain a MR image of the area of the subject of interest further comprises rejecting and/or weighing k-space samples from the first and/or the second subset of k-space samples depending on the detected motion of the area of the subject of interest, This object is also achieved by a computer-readable medium such as a storage device, a floppy disk, compact disc, CD, digital versatile disc, DVD, Blu-ray disc, or a random access memory, RAM, containing a set of instructions that causes a computer to perform the above method.

This object is further achieved by a computer program product comprising a computer-usable medium including computer-usable program code, wherein the computer-usable program code is adapted to execute the above method.

Furthermore, this object is achieved by a software package for upgrading a MR imaging system, whereby the software package contains instructions for controlling the MR imaging system according to the above method.

Still further, this object is achieved by a MR imaging system for providing an image representation of at least an area of a subject of interest positioned in an examination space of the MR imaging system, wherein the MR imaging system is adapted to perform the above method for magnetic resonance imaging.

Motion is the number one issue in MRI of the body of a subject of interest that causes image quality degradation and consistency issues. This refers in particular to breathing motion of the thorax. State of the Art approaches to improve image quality when performing MRI scanning with breath-hold are based on data processing based on the acquired k-space data, so that artifacts based on motion of the subject of interest, in particular within the area of the subject of interest, for which the MR images are to be generated.

With the motion detection of the subject of interest in the area of the subject of interest, reliability of data obtained by k-space sampling can be increased already at the stage of generation of k-space samples. Control of movement, in particular of breathing movement, can be improved, since a reliable relation between issuing the breath-hold command and the motion stop can be established by the motion detection in the area of the subject of interest. Feedback control of the state of breathing of the subject of interest can be realized in addition to issuing the breath-hold command. Accordingly, k-space sampling of the area of the subject of interest can be performed with a monitored breath-hold condition, so that the obtained k-space samples allow the generation of MR images with increased quality, e.g. with reduced artifacts. The necessity to perform data processing, e.g. to reduce artifacts, can be reduced, so that MR images can be obtained with reduced computational power. Furthermore, the k-space sampling of the area of the subject of interest can be performed in a time-efficient manner, since the k-space sampling can be started immediately upon detection of the breath-hold condition. Therefore, the duration of the breath-hold condition of the subject of interest can be fully utilized to acquire k-space samples suitable for obtaining MR-images. Partial re-acquisition of k-space samples or even repeated generation of MR images can be reduced. In the above method, the step of performing motion detection of the subject of interest to detect a breath-hold condition in the area of the subject of interest can be started prior to the step of issuing a breath-hold command to the subject of interest. These differences in the method steps have no impact on the detection of the breath-hold condition. Issuing a breath-hold command to the subject of interest can be started automatically by the MR imaging system, when an imaging sequence is started, or by an operator of the MR imaging system. The breath-hold command can be any kind of suitable command, including an audible command, a visual command, or a tactile command. Accordingly, the MR imaging system may comprise means for providing the command to the breath-hold command, e.g. a loudspeaker system, signaling lights indicating a command, a display device for displaying a command in a readable manner, or others. The given resolution refers to a resolution for the MR-image. Depending on the resolution, the minimum number of required k-space samples varies. Motion of the area of the subject of interest itself is most important, although also the motion of other areas of the subject of interest may be used to detect breath-hold condition of the subject of interest, in case they give an indication of ongoing or upcoming motion in the area of the subject of interest, which is subject to MR imaging. Preferably, motion is detected directly in the area of the subject of interest. After acquisition of the k-space samples, the samples are processed to obtain the MR image of the area of the subject of interest. The area of the subject of interest in 2, 3 or 4 dimensional space is mapable to k-space. Based on this mapping, k-space data can be used to obtain the MR image of the area of the subject of interest. Since the time for generation of an entire set of k-space samples typically takes about 12 to 18 seconds, breath-hold is sometimes difficult to achieve for this scanning time. Typical durations of breath-hold, which can be achieved by subjects of interest, are about 8 to 12 seconds. Accordingly, when monitoring the breath-hold condition, k-space data acquisition can be immediately started without wasting valuable time. Furthermore, the k-space data acquisition is only started, after breath-hold condition has been achieved, so that the acquired k-space samples are reliable for MR image generation. An unnecessary extension of the breath-hold requirement, e.g. by adding a typical waiting time after the breath-hold command has been issued to assure that breath-hold is achieved has started before the k-space data generation starts, can be avoided.

The general idea is to start acquisition of the first subset of samples already before the breath-hold condition has been detected. Accordingly, the order of the method steps prior to the detection of the breath-hold condition can be modified. For example, the step of performing k-space sampling of the area of the subject of interest to acquire a first subset of k-space samples can be performed prior, during or immediately after issuing the breath-hold command. In one embodiment, acquisition of the first subset of k-space samples is automatically started when the breath hold command has been issued. The k-space samples may be assigned to the first and second subsets depending on a chosen k-space acquisition approach/strategy. Furthermore, different requirements or quality criteria may be defined, e.g. a quality criterion for the k-space data or an a priori determined timing criterion, so that the acquisition of the first subset of k-space samples can e.g. be started a given time prior to issuing the breath-hold command. Alternatively, the acquisition of the k-space samples of the first subset can be started immediately upon issuing the breath-hold command. Also a convergence to the breath-hold condition can be used to start acquisition of the first subset of k-space samples. Accordingly, first k-space samples are already available when the k-space sampling of the second subset is started. With the k-space sampling of the first subset of k-space samples prior to the detection of the breath-hold condition, the k-space sampling for the entire area, e.g. the acquisition of the first and second subset of k-space samples, can be performed in an efficient way, since the time the breath-hold condition is maintained by the subject of interest can be efficiently used to acquire k-space samples of the second subset. K-space samples of the first subset can already be acquired prior to the detection of the breath-hold condition.

Motion detection during acquisition of k-space samples enables verification of motion compliance for the acquired k-space samples. E.g., in case insufficient motion compliance is detected, acquired k-space samples can be discarded, or the acquisition of k-space samples can be interrupted until motion compliance is established again. Motion compliance refers to a state of motion of the area of the subject of interest, which enables the acquisition of k-space samples suitable for MR image generation of MR images with high image quality and few artifacts. Motion compliance can depend on a sampling sequence for acquiring k-space samples. For example, central k-space samples have an impact on the entire MR image, so that motion compliance will be considered more strictly for central k-space samples than for peripheral k-space samples. Accordingly, motion compliance can be a full motion stop, e.g. a full breath-hold, or a motion condition with a limited motion, e.g. a motion at a low velocity.

According to a preferred embodiment the step of performing k-space sampling to acquire a second subset of k-space samples covering the area of the subject of interest comprises re-acquiring k-space samples from the first and/or the second subset of k-space samples depending on the detected motion of the area of the subject of interest. In case insufficient motion compliance is detected for k-space samples of the first subset prior to the detection of the breath-hold condition, acquired k-space samples can be discarded. Discarded k-space samples can then be re-acquired after the detection of the breath-hold condition, or data processing can be performed, e.g. to generate discarded k-space samples from the acquired k-space samples. Also re-acquisition of k-space samples of the second subset can be applied according to the above principles in respect to motion compliance.

According to a preferred embodiment the step of performing k-space sampling of the area of the subject of interest to acquire the first subset of k-space samples from the set k-space samples covering the area of the subject of interest with a given resolution comprises performing repetitive k-space sampling of the first subset of k-space samples. Accordingly, the k-space samples of the first subset are continuously re-acquired until the breath-hold condition is detected. Hence, the k-space samples of the first subset are provided with a motion of the area of the subject of interest close to the breath-hold condition. This improves the quality of the acquisition of the k-space samples of the first subset, since it can be assumed that less movement occurs close to breath-hold condition.

According to a preferred embodiment the step of performing k-space sampling of the area of the subject of interest to acquire a first subset of k-space samples comprises performing k-space sampling starting in a periphery of the k-space and extending k-space sampling to a center of the k-space. Central k-space samples of the area of the subject of interest are generally most important for data processing to obtain the MR image of the subject of interest. In particular, central k-space samples are important to determine the contrast characteristics of the MR image. Therefore, avoiding motion during acquisition of central k-space samples is important in order to avoid or reduce effects of gross motion, blurring and signal loss, which occur in particular due to phase incoherencies. Accordingly, when the most important k-space samples of the first subset of k-space samples are acquired at or shortly before the detection of the breath-hold condition, it is assumed that the motion of the area of the subject of interest has stopped or almost stopped, so that the k-space samples are reliable for MR image generation.

According to a preferred embodiment the step of performing k-space sampling to acquire a second subset of k-space samples covering the area of the subject of interest comprises performing k-space sampling starting in a center of the k-space and extending k-space sampling to a periphery of the k-space. Again, central k-space samples of the area of the subject of interest are generally most important for data processing to obtain the MR image of the subject of interest. In particular, central k-space samples are important to determine the contrast characteristics of the MR image. Therefore, avoiding motion during acquisition of central k-space samples is important in order to avoid or reduce effects of gross motion, blurring and signal loss, which occur in particular due to phase incoherencies. Accordingly, when the most important k-space samples of the second subset of k-space samples are acquired at or shortly after the detection of the breath-hold condition, it is assumed that the motion of the area of the subject of interest is stopped or at least almost stopped, so that the k-space samples are reliable for MR image generation. Since there is a possibility that the breath-hold condition cannot be maintained by the subject of interest for the time required to acquire all k-space samples of the subject of interest with the given resolution, central k-space samples are acquired first, so that only reliable central k-space samples are acquired.

According to a preferred embodiment the step of performing k-space sampling to acquire a second subset of k-space samples covering the area of the subject of interest comprises performing motion detection of the area of the subject of interest, and upon detection of motion in the area of the subject of interest discarding the k-space samples, until breath-hold condition has been detected again. This step can be repeated until a sufficient number of k-space samples is generated to obtain a MR image from the obtained k-space samples. A sample sequence can be stopped at any point upon detection of motion of the area of the subject of interest, and can be continued at the same step of the sample sequence, where the k-space samples have been discarded upon detection of motion of the area of the subject of interest. Accordingly, even if the subject of interest cannot maintain motion stop for the time required to provide k-space samples of the entire area, the interrupted k-space sampling based on the detection of motion stop can provide a set of samples covering the entire k-space of the area of the subject of interest. The samples can be provided without motion causing artifacts in the MR images, since only suitable k-space samples without motion can be used for image generation. In particular in the case of breath-hold, only data with the thorax at approximately the same position that show a good consistency with respect to previous breath holds can be accepted, so that the interruption of the k-space sampling does not lead to image generation with reduced quality. This method enables MR image generation also for subjects of interests, which cannot stop motion, i.e. which cannot maintain breath-hold condition, for a time sufficient to acquire the required k-space samples. Preferably, upon detection of motion, another breath-hold command is issued to the subject of interest.

According to a preferred embodiment the step of performing motion detection of the subject of interest to detect a breath-hold condition in the area of the subject of interest comprises monitoring a respiratory navigator signal. The respiratory navigator signal refers to an image based acquisition of a 1D, 2D or 3D image. The 1D respiratory navigator signal is also called "pencil beam" and obtains a 1D-profile of the subject of interest in the area of the subject of interest. The respiratory navigator signal is typically used to monitor the diaphragm of the subject of interest in the feet-head direction to identify breathing movement by movement of the diaphragm. When the respiratory navigator signal is stable, it is assumed that the subject of interest has stopped breathing, i.e. performs breath-hold. Motion detection based on the respiratory navigator signal can be easily implemented in existing MR imaging systems without the need for hardware modifications, since no additional hardware is required. The respiratory navigator signal can be monitored with means of a typical MR imaging system, which uses an adapted imaging method.

According to a preferred embodiment the step of performing motion detection of the subject of interest to detect a breath-hold condition in the area of the subject of interest comprises defining at least one k-space navigator, and performing motion detection of the subject of interest in the area of the subject of interest by performing real-time monitoring of the at least one k-space navigator. An example of a k-space navigator technique is the so called orbital navigator (O-NAV) that can use a dissimilarity matrix to check for consistencies of k-space data. This enables to perform real-time motion detection of the subject of interest. The k-space navigator may be implemented as an interleaving k-space data acquisition step, which is performed in addition to the acquisition of k-space samples for the MR image. The k-space navigators can be equidistantly interleaved where a series of multiple k-space acquisition, which is grouped in a segment of spin echo or gradient echo readouts or shots. Nevertheless image and k-space navigator can be also interleaved non-equidistantly. A frequency for the interleaved k-space data acquisition may be varied depending on different conditions. E.g. after issuing the motion stop command, it might be useful to increase the monitoring of the k-space navigator to be able to precisely detect when the breath-hold condition is reached, whereas after the breath-hold condition has been detected, motion detection frequency can be reduced. Alternatively, the k-space navigator data can correspond to inherent imaging data used for MR image generation, i.e. to k-space samples for the MR image, when the samples are repeatedly generated. This may refer to the acquisition of the first subset of k-space samples prior to the detection of the breath-hold condition, when the first subset of k-space samples is repeatedly acquired until breath-hold condition is detected. Typically, multiple k-space navigators are implemented for motion detection. Preferably, circular k-space navigators are used. The circular k-space navigators may be arranged circular around a center of the k-space. The implementation of motion detection based on the k-space navigator data can be easily implemented in existing MR imaging systems without the need for hardware modifications, since no additional hardware is required. K-space navigator can be used to monitor movements of the subject of interest with means of a typical MR imaging system, which uses an adapted imaging method.

According to a preferred embodiment the step of performing motion detection of the subject of interest to detect a breath-hold condition in the area of the subject of interest comprises repeatedly processing the k-space samples of the first subset of k-space samples to obtain images of the area of the subject of interest, and performing motion detection of the subject of interest from the obtained images. Known techniques for detection of motion in images can be used. Repeated processing of k-space samples implies that the k-space samples are repeatedly acquired. This implementation of motion detection requires fast image processing, since a typical time for image generation based on the k-space samples is about 50 ms. The implementation of motion detection based on the images based on the k-space sampling can be easily implemented in existing MR imaging systems without the need for hardware modifications, since no additional hardware is required. Images based on the k-space sampling can be used to monitor movements of the subject of interest with means of a typical MR imaging system, which uses an adapted imaging method. The motion detection based on the obtained images can be applied in an analogous way to performing k-space sampling of the second subset of k-space samples.

According to a preferred embodiment the step of performing motion detection of the subject of interest to detect a breath-hold condition in the area of the subject of interest comprises performing generation of k-space samples based on the first subset of k-space samples, and evaluating consistency of the generated samples and corresponding acquired samples within the k-space. Generation of k-space can be performed based on known techniques, e.g. the COCOA approach (Data Convolution and Combination Operation (COCOA) for Motion Ghost Artifacts Reduction), which are currently used to perform post processing of k-space data to reduce artifacts based on already obtained k-space samples. Nevertheless, k-space generation can also be used prior to obtaining the full amount of k-space samples to estimate if the subject of interest is moving or not. Preferably, samples from a k-space kernel area are used for generation of k-space samples. Based on the acquired k-space samples, neighboring k-space samples can be estimated. If the deviation between subsequent k-space samples including the generated k-space samples is bigger than a threshold value, this is an indicator for motion, i.e. the subject of interest has not yet stopped moving or, in particular, breathing. The implementation of motion detection based on the k-space generation can be easily implemented in existing MR imaging systems without the need for hardware modifications, since no additional hardware is required. Data from the k-space generation can be used to monitor movements of the subject of interest with means of a typical MR imaging system, which uses an adapted imaging method. Furthermore, k-space generation can be performed with very low impact on existing MR imaging systems. Nevertheless, this implementation requires fast data processing. This approach is also advantageous for replacing acquired k-space samples. Since the quality of the motion stop evolves during the typically first 4 seconds of breath-hold condition, k-space samples acquired after that time are typically more stable than early k-space samples. The COCOA can be used to generate k-space samples for early acquired k-space samples. The generated k-space samples are then compared to acquired k-space samples. Upon the comparison, the early acquired k-space samples may be replaced by generated data or re-acquired.

According to a preferred embodiment the method comprises the additional step of providing a motion detection device for monitoring motion of the subject of interest in the area of the subject of interest, wherein the step of performing motion detection of the subject of interest to detect a breath-hold condition in the area of the subject of interest comprises performing breath-hold detection using the motion detection device. The corresponding MR imaging system comprises a motion detection device for monitoring motion of the subject of interest in the area of the subject of interest, and the MR imaging system is adapted to perform motion detection of the subject of interest in the area of the subject of interest using the motion detection device. Different kinds of motion detection devices can be used. The usage of the motion detection devices can be dependent on the particular area of the subject of interest. In general, different kinds of motion detection devices are suitable, including optical motion detection devices, which are e.g. based on a camera. The motion detection device is preferably connected to a control unit of the MR imaging system, so that the k-space sampling can be controlled based on motion detection performed using the motion detection device. The motion detection device can be implemented using any kind of sensor, which is connected e.g. to the control unit of the MR imaging system, wherein signal processing to detect motion is performed e.g. by the control unit based on sensor input from the sensor. The implementation of motion detection using the motion detection device can be easily implemented in existing MR imaging systems, since additional computational power required for motion detection is very low. Accordingly, the motion detection device can be easily used together with a typical MR imaging system, which uses an imaging method adapted to motion detection based on the motion detection device. The motion detection device may comprise an optical sensor in a visible or THz frequency band or an ultrasonic device, which are used for image generation. Further preferred, the motion detection device may be adapted for video generation to perform motion detection based on the generated video signals. One advantage of the use of the motion detection device is that it does not interfere with the acquisition and hence does not require extra scan time.

According to a preferred embodiment the step of providing a motion detection device for monitoring motion of the subject of interest in the area of the subject of interest comprises providing a respiratory belt, and the step of performing motion detection of the subject of interest in the area of the subject of interest comprises performing motion detection using the respiratory belt. The respiratory belt is in particular suitable for breathing detection. It can be put directly around a thorax of the subject of interest to provide a reliable signal for detecting breathing and breath-hold of a subject of interest. The respiratory belt is preferably a pneumatic respiratory belt, which can easily be used in MR environments. The pneumatic motion detection can be provided without components susceptible to magnetic and/or RF fields.

According to a preferred embodiment the step of performing motion detection of the subject of interest to detect a breath-hold condition in the area of the subject of interest comprises monitoring motion in the area of the subject of interest to detect convergence to the breath-hold condition. Convergence to the breath-hold condition, e.g. a state where motion has almost stopped, can provide an indication that acquisition of k-space samples of the first and/or the second subset of k-space samples can be started, since motion stop is supposed to occur in a predictable manner, typically in a short time. The motion convergence to a breath-hold condition for example could be achieved by estimating the motion velocity at the current point of time. This motion convergence could be used to optimize acquisition or re-acquisition of k-space samples, or sampling of peripheral k-space samples in an initial scan phase. Furthermore, acquisition or re-acquisition of central k-space samples can be performed only in case that the motion converges to a breath-hold condition. The velocity can be obtained by comparing motion state differences under consideration of a frequency for monitoring the motion. Preferably, k-space samples of the first subset are only accepted if they fall e. g. within a 1 or 1.5 sec timing criterion before the detection of the breath-hold condition. Accordingly, the second subset of k-space samples can be generated with samples adequate for image reconstruction, since motion prior to breath-hold condition is already reduced and has low impact in the image generation.

According to a preferred embodiment the step of monitoring motion in the area of the of the subject of interest to detect convergence to the breath-hold condition comprises monitoring a velocity of motion in the area of the of the subject of interest, and the step of detection of the breath-hold condition in the area of the subject of interest comprises detection of the breath-hold condition as detection of the velocity of motion in the area of the of the subject of interest being close to 0 with a margin. This allows using the velocity itself as an indication of breath-hold condition. The margin is required, since the subject of interest typically maintains some movement, even when breath-hold is performed, to allow detection of breath-hold condition also for imperfect breath-hold. The velocity can be obtained by comparing motion state differences under consideration of a frequency for monitoring the motion.

According to a preferred embodiment the method comprises the additional step of adapting a sampling strategy for performing the k-space sampling of the area of the subject of interest depending on the motion detection and/or convergence of the breath-hold condition of the subject of interest. Hence, k-space samples can be acquired when most appropriate in the sense of image generation with high quality and few artifacts. As one example, k-space samples of regions, which have a high impact on the MR image quality, can be acquired at breath-hold condition, and other samples can be acquired when breath-hold condition is not fulfilled. Furthermore, motion convergence information can be used to estimate in advance when k-space samples can be acquired with breath-hold condition to enable the anticipation of breath-hold condition. This allows an advance adaptation of the sampling strategy, so that the acquisition of k-space samples can be performed in an efficient manner. Preferably, a real-time adaption of the k-space sampling strategy is performed based on the current motion status or the convergence of the motion towards breath-hold condition. The adaptation of the sampling strategy refers to the entire set of k-space samples as well as to the first and second subset of k-space samples. The adaptation of the sampling strategy is helpful when the first and/or the second subset of k-space samples contains central k-space samples and peripheral k-space samples, so that central k-space samples can be acquired at most suitable motion conditions, i.e. central k-space samples are acquired with breath-hold condition, and peripheral k-space samples are preferably required at breath-hold condition, and without breath-hold, if breath-hold condition is not achieved e.g. for a sufficient time.

According to a preferred embodiment the step of performing k-space sampling of the area of the subject of interest comprises performing k-space sampling with a distributed sampling scheme, and the step of processing the acquired k-space samples comprises reconstruction of holes in the k-space based on the acquired k-space samples based on the distributed sampling scheme. Preferably, the sampling scheme is a Poisson disc sampling scheme. Distribution of the k-space samples in the k-space enables reliable MR image generation with few k-space samples. Furthermore, reconstruction of k-space samples can be easily performed, e.g. according to a compressed sensing algorithm. Iterative sense algorithm can also be used in this context.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
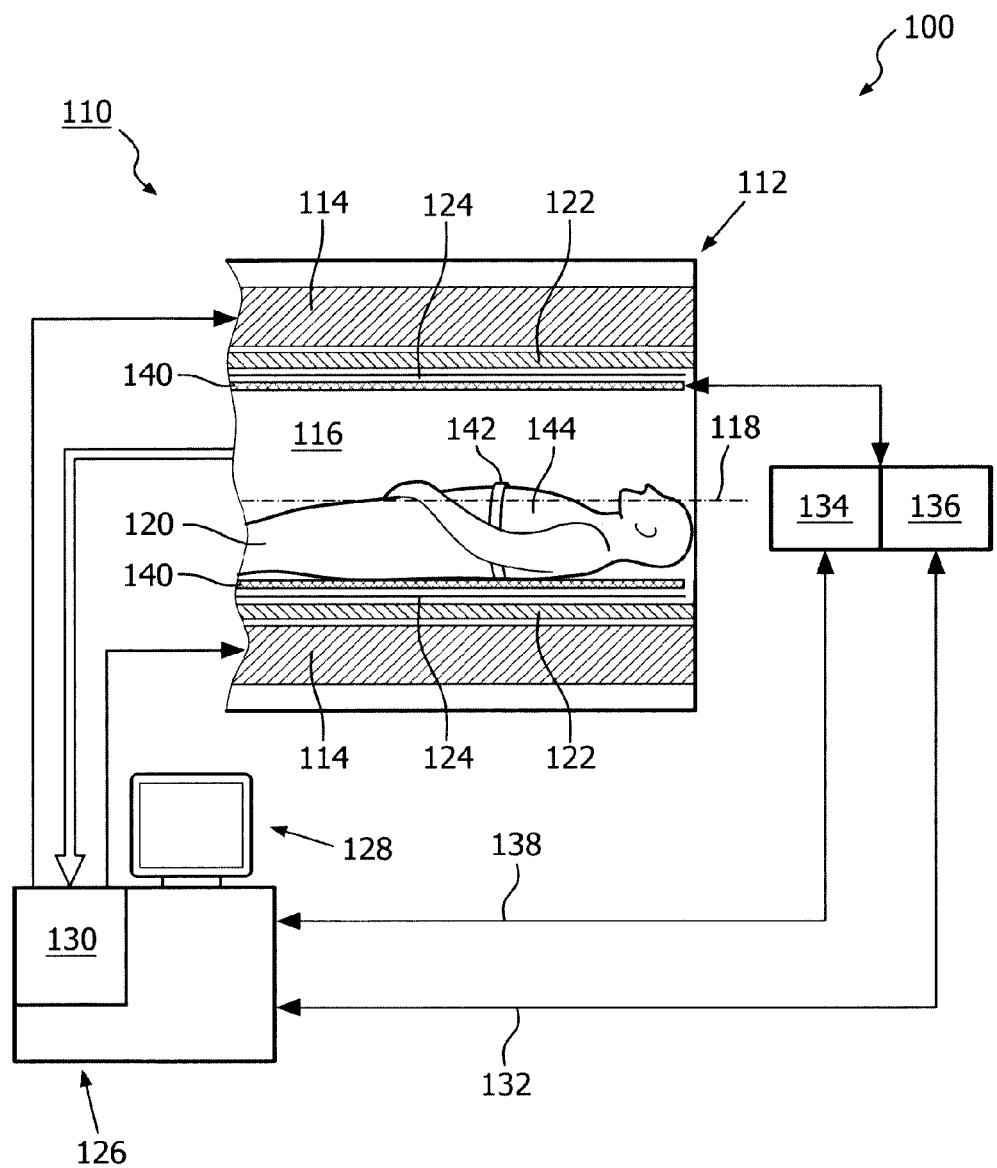
FIG. 1 shows a general setup of a magnetic resonance imaging system in accordance with a preferred embodiment of the invention including a respiratory belt.

FIG. 1 shows a schematic illustration of a part of an embodiment of a magnetic resonance (MR) imaging system 110 comprising an MR scanner 112. The MR imaging system 110 includes a main magnet 114 provided for generating a static magnetic field. The main magnet 114 has a central bore that provides an examination space 116 around a center axis 118 for a subject of interest 120, usually a patient, to be positioned within. As not shown in detail, the main magnet 114 comprises two sets of coils, a set of inner coils and a set of outer coils, which are cylindrically arranged in an inner part and at an outer part of the main magnet 114, respectively, and which are spaced apart along the z-axis of the main magnet 114. Further, the MR imaging system 110 comprises a magnetic gradient coil system 122, provided for generating gradient magnetic fields superimposed to the static magnetic field. The main magnet 122 is concentrically arranged within the bore of the main magnet 114, as known in the art.

Further, the MR imaging system 110 includes a radio frequency (RF) antenna device 140 designed as a whole-body coil having a tubular body. The RF antenna device 140 is provided for applying an RF magnetic field to the examination space 116 during RF transmit phases to excite nuclei of the subject of interest 120. The RF antenna device 140 is also provided to receive MR signal from the excited nuclei during RF receive phases. In a state of operation of the MR imaging system 110, RF transmit phases and RF receive phases are taking place in a consecutive manner. The RF antenna device 140 is arranged concentrically within the bore of the main magnet 114. As is known in the art, a cylindrical metal RF screen 124 is arranged concentrically between the main magnet 122 and the RF antenna device 140.

Moreover, the MR imaging system 110 comprises an MR image reconstruction unit 130 provided for reconstructing MR images from the acquired MR signals and an MR imaging system control unit 126 with a monitor unit 128 provided to control functions of the MR scanner 112, as is commonly known in the art. Control lines 132 are installed between the MR imaging system control unit 126 and an RF transmitter unit 134 that is provided to feed RF power of an MR radio frequency to the RF antenna device 140 via an RF switching unit 136 during the RF transmit phases. The RF switching unit 136 in turn is also controlled by the MR imaging system control unit 126, and another control line 138 is installed between the MR imaging system control unit 126 and the RF switching unit 136 to serve that purpose. During RF receive phase, the RF switching unit 136 directs the MR signals from the RF antenna device 140 to the MR image reconstruction unit 130 after pre-amplification.

Figure 2:
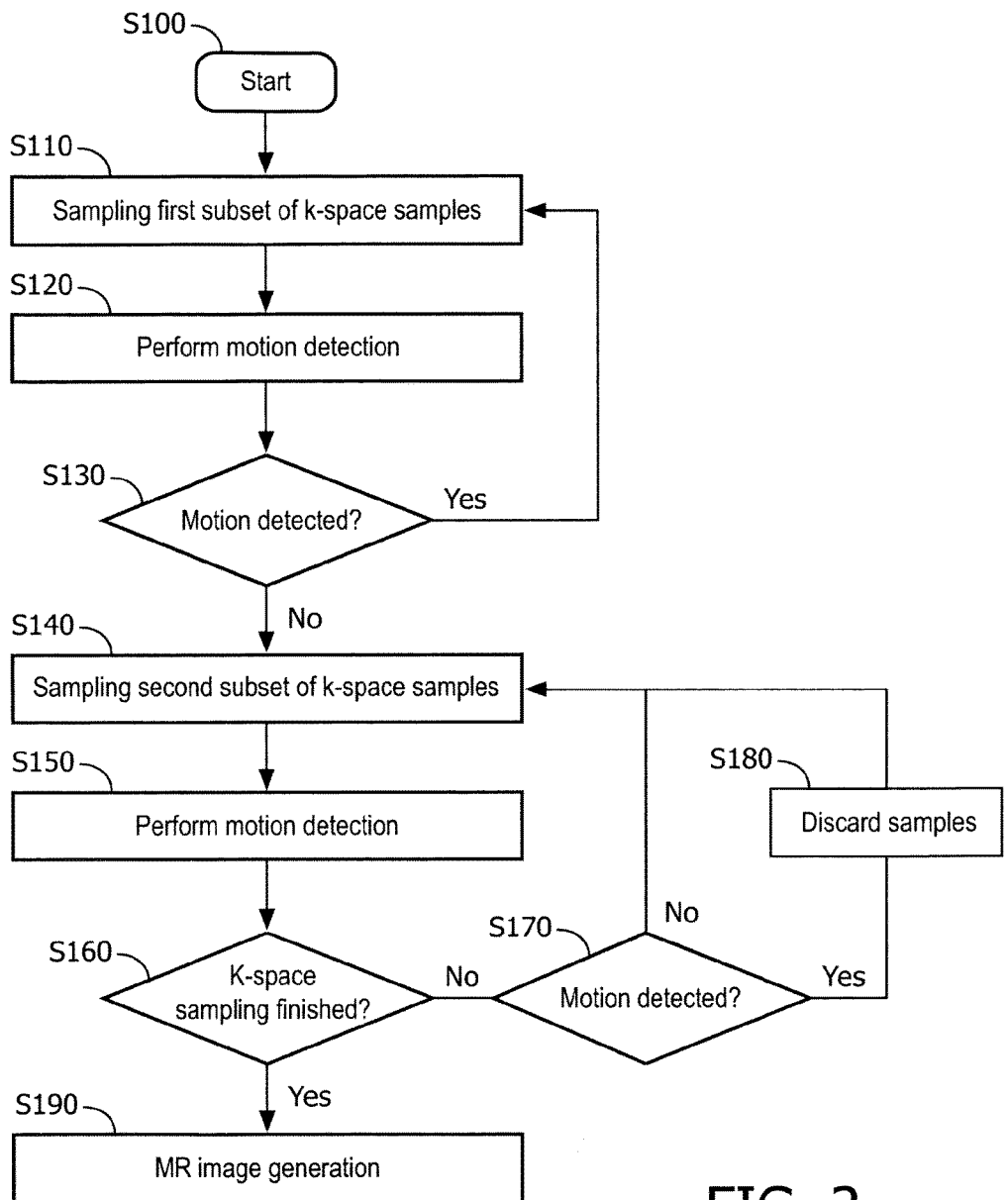
FIG. 2 shows a diagram indicating a method for magnetic resonance image generation according to the preferred embodiment.

Referring now to FIG. 2, a method for MR imaging of an area 144 of the subject of interest 120 is described with reference to the MR imaging system 110 according to the described embodiment. The method starts in step S100 with the subject of interest 120 being positioned in the examination space 116 of the MR imaging system 110. The area 144 of the subject of interest 120 in this embodiment is the thorax of the subject of interest 120. Furthermore, a breath-hold command is issued as acoustic command, i.e. a spoken command to stop breathing, from an operator of the MR imaging system 110 to the subject of interest 120. In an alternative embodiment, a control SW running e.g. on the control unit 126, issues the breath-hold command to the subject of interest 120 as playback of an acoustic sequence by means of a loudspeaker.

In step S110, the MR imaging system 110 starts performing repeated k-space 154 sampling of a first subset of k-space 154 samples covering the thorax 144 of the subject of interest 120. The first subset of k-space 154 samples contains mainly peripheral k-space 154 samples. Furthermore, the k-space 154 sampling of the first subset of k-space 154 samples starts in a periphery 152 of the k-space 154 and extending k-space 154 sampling to a center 150 of the k-space 154. The k-space 154 samples of the first subset are chosen from the k-space 154 samples covering the thorax 144 of the subject of interest 120 with a given resolution depending on a chosen k-space 154 acquisition approach/strategy. The given resolution refers to a resolution for the MR-image. Depending on the resolution, the minimum number of required k-space 154 samples varies. In an alternative embodiment, the acquisition of the first subset of k-space 154 samples is already started before the breath-hold command has been issued.

In step S120, the MR imaging system 110 performs motion detection of the thorax 144 of the subject of interest 120. Details regarding to the motion detection of step S120 are provided below. In an alternative embodiment, the step S120 of performing motion detection is started prior to the step S100 of issuing the breath-hold command to the subject of interest 120.

In step S130, the MR imaging system 110 checks for breath-hold condition. Accordingly, the MR imaging system 110 verifies if the subject of interest 120 has stopped breathing and if a stable breath-hold is established. Motion detection is implemented detecting convergence to the breath-hold condition. Convergence to the breath-hold condition provides information about the time when the breath-hold condition starts prior to the breath-hold condition and is monitored using the motion velocity of the thorax 144 of the subject of interest 120 at a current point of time. The velocity is obtained by comparing motion state differences under consideration of a frequency for monitoring the motion. Accordingly, convergence to the breath-hold condition is detected based on the velocity of motion in the thorax 144 of the subject of interest 120, whereby a velocity being close to 0 with a margin indicates the breath-hold condition. In case motion has been detected, the method returns to step S110, so that k-space 154 samples of the first subset of k-space 154 samples are acquired repetitively and most recent k-space 154 samples replace prior k-space 154 samples. Otherwise the method continues with step S140. In an alternative embodiment, the motion convergence is used to adapt acquisition or re-acquisition of the first subset of k-space 154 samples.

In step S140, the MR imaging system 110 has switched acquisition of k-space 154 samples from the first subset of k-space 154 samples to a second subset of k-space 154 samples to complete k-space 154 sampling of the thorax 144 of the subject of interest 120. Accordingly, the second subset of k-space 154 samples comprises k-space 154 samples covering the thorax 144 of the subject of interest 120 with a given resolution, which are not already part of the first subset of k-space 154 samples. The acquisition of the second subset of k-space 154 samples is started immediately upon detection of the breath-hold condition, whereby first central k-space 154 samples are acquired and k-space 154 sampling of the second subset of k-space 154 samples is then extended to peripheral k-space 154 samples. This way, the entire k-space 154 in respect to the thorax 144 of the subject of interest 120 is covered.

While the acquisition of k-space 154 samples of the second subset of k-space 154 samples is performed, in step S150 motion detection is performed. The principles applicable in step S120 also apply to step S150, as described in detail below. In an alternative embodiment, the sampling strategy for performing the k-space 154 sampling of the thorax 144 of the subject of interest 120 is adapted depending on the motion detection and/or convergence of the breath-hold condition. Accordingly, when breath-hold condition is achieved in a stable manner, central k-space 154 samples are acquired, whereas in the other case peripheral k-space 154 samples are acquired in subsequent step S140.

In step S160, the MR imaging system 110 verifies if k-space 154 sampling has provided sufficient k-space 154 samples for MR image generation, i.e. if the acquired k-space 154 samples of the first and second subset of k-space 154 samples are sufficient for MR image generation with the given resolution. This includes verifying, if k-space 154 samples, which have been discarded based on the detected motion of the thorax 144 of the subject of interest 120, have been re-acquired, please compare later step S180. Accordingly, if k-space 154 sampling has finished, the method continues with MR image generation in step S190. Otherwise, the method continues with step S170. Step S160 can be performed alternatively at different points of the diagram of FIG. 2, e.g. before the motion detection step S150 or after step S170, which is described below.

In step S170, the MR imaging system 110 verifies if the subject of interest 120 has stopped breathing and breath-hold condition is achieved. In case motion or insufficient motion compliance has been detected, the method discards the recent k-space 154 samples in step S180 and continues with step S140 acquiring k-space 154 samples of the second subset of k-space 154 samples according to the previous sampling step in order to obtain valid k-space 154 samples for replacing the discarded k-space 154 samples. Accordingly, the sample sequence is stopped at any point upon detection of motion of the thorax 144 of the subject of interest 120 and continued at the same step of the sample sequence upon detection of breath-hold condition. The motion detection during acquisition of k-space 154 samples enables a verification of motion compliance for the acquired k-space 154 samples. Motion compliance refers to a state of motion of the area of the subject of interest, which enables the acquisition of k-space 154 samples suitable for MR image generation of MR images. Otherwise the method continues with step S140 with k-space 154 sampling in order to obtain further k-space 154 samples of the thorax 144.

In step S190, the MR imaging system 110 processes the k-space 154 samples of the first and second subset of k-space 154 samples to obtain a MR image of the thorax 144 of the subject of interest 120. The k-space 154 data has been acquired with different phase encoding steps, which has been digitized by collecting a number of samples according to a distributed sampling scheme, which is a Poisson disc sampling scheme in this embodiment. The first and the second subset of k-space 154 samples together cover the thorax 144 of the subject of interest 120 with a given resolution. The set of k-space 154 samples comprising the first and second subset of k-space 154 samples is processed and transformed to an MR image, e. g. by inverse Fourier transformation. In this step, k-space 154 samples are rejected and/or weighted depending on the detected motion of the thorax 144 of the subject of interest 120 at the time the k-space 154 samples have been acquired. Hence, a mapping of the k-space 154 samples into the MR image of the thorax 144 of the subject of interest 120 is performed to obtain the MR image of the thorax 144 of the subject of interest 120. Furthermore, based on the distributed sampling scheme, reconstruction of holes in the k-space 154 based on the acquired k-space 154 samples is performed according to a compressed sensing algorithm.

Figure 3:
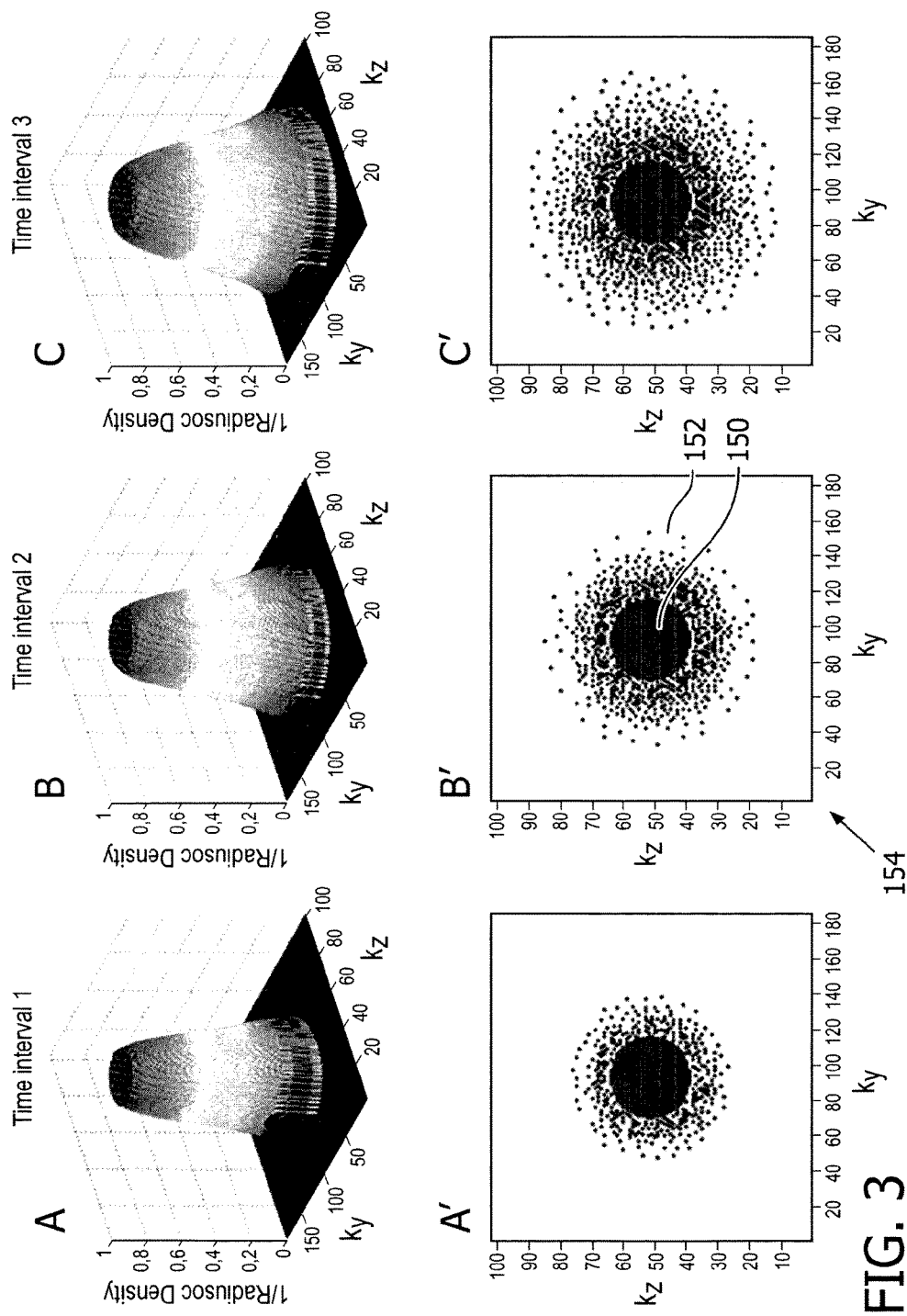
FIG. 3 shows the density of sampling points and the corresponding sampling pattern after 1, 2 and 3 iterations.
Figure 4:
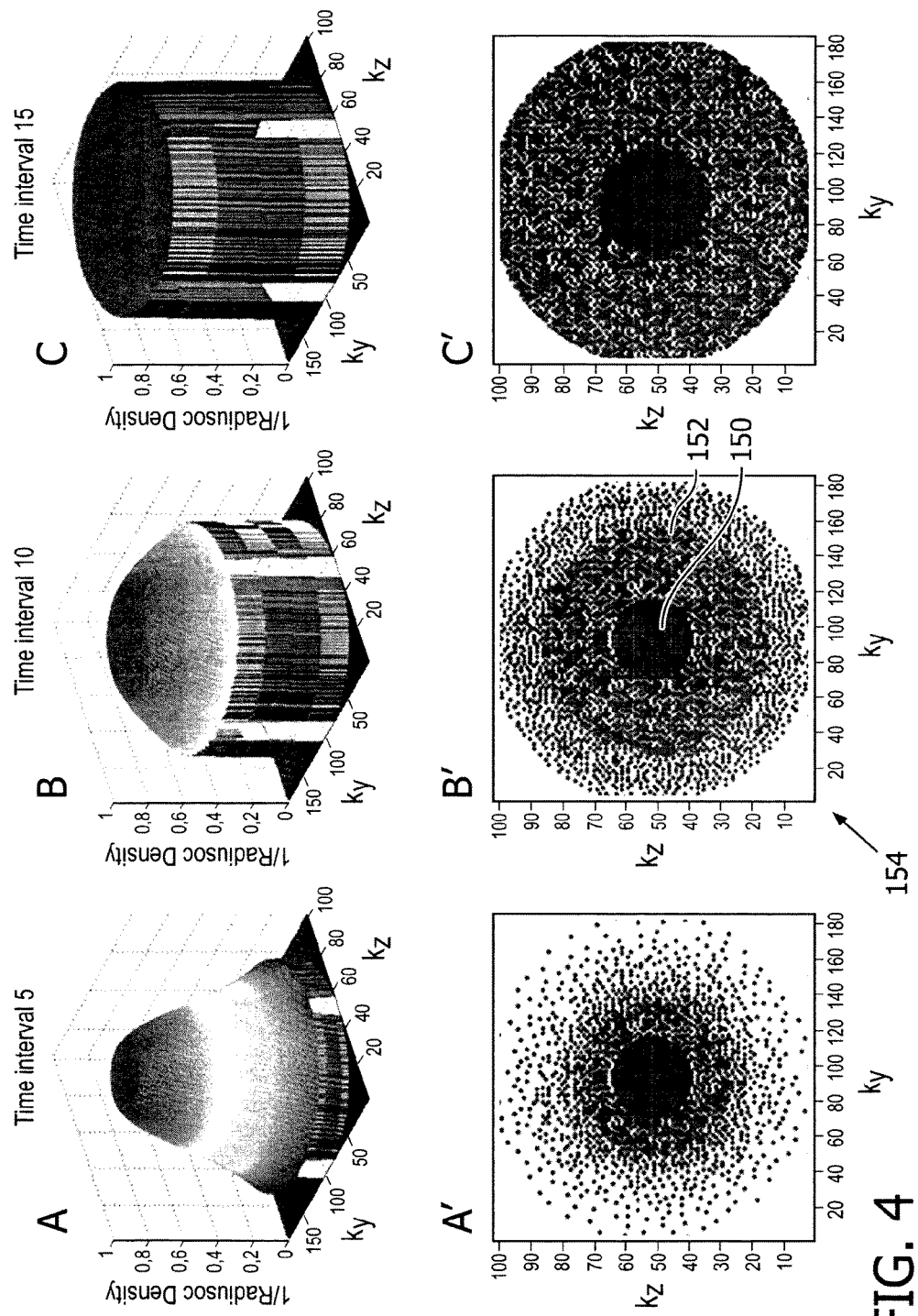
FIG. 4 shows the density of sampling points and the corresponding sampling pattern after 5, 10 and 15 iterations.
Figure 5:
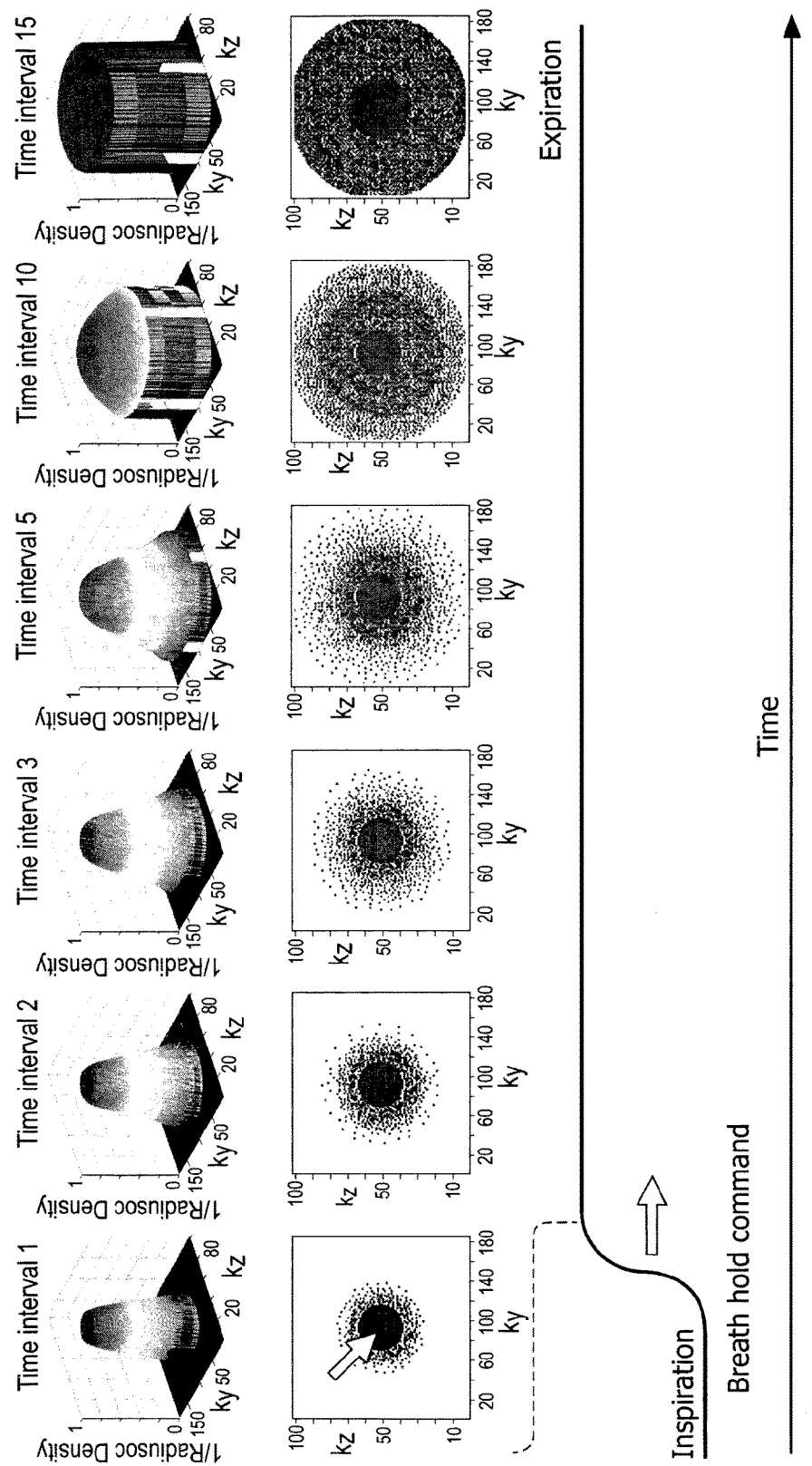
FIG. 5 shows the density of sampling points according to FIGS. 3 and 4 together with a timing graph and a respiration graph.

FIGS. 3 and 4 show by way of example the density of sampling points and the corresponding sampling pattern after 1, 2, 3, 5, 10 and 15 iterations, which are performed in step S140, when acquisition of k-space 154 samples for the second subset of k-space 154 samples is extended from central k-space 154 samples to peripheral k-space 154 samples. FIG. 5 additionally shows the timing and respiration as indicated by the respective graph. The FIGS. 3A, 3B, 3C, 4A, 4B and 4C show the density of the sampling points. The FIGS. 3A', 3B', 3C', 4A', 4B' and 4C' show the sampling pattern in k-space 154. The distribution of the density of sampled points results from two conditions: the spatial resolution increases over time and the sampling density monotonically decreases toward the peripheral k-space 154. The maximum spatial resolution is defined by the operator. Both the maximum sampling density near the center 150 of k-space 154, and the decay rate towards the periphery 152 of the k-space 154 are adapted in the course of the acquisition, while the averaged reduction factor is successively reduced. To generate the sampling pattern, Poisson disk sampling is used as discussed above. Poisson disk sampling is a random distribution of samples with the additional constraint that neighboring samples must not fall below a defined distance. Due to the above mentioned, upon issuing the breath-hold command, inspiration stops and breath-hold condition is achieved. At that time, the central k-space 154 samples are acquired first, and peripheral k-space 154 samples are included afterwards towards the time, when expiration starts, i.e. breath-hold condition is stopped. As can be seen in the figures, the sampling density drops to zero at the edge of the k-space 154. A random respectively pseudo-random selection of the plurality of k-space 154 samples being located in the peripheral k-space 154 leads to a nearly locally homogeneous subsampling of the periphery 152 of the k-space 154.

Below is described step S120 of motion detection in detail for different embodiments of the invention. According to a first embodiment, in step S120 a respiratory navigator signal is monitored. The respiratory navigator signal refers to an image based acquisition of a 1D image in this embodiment. The 1D respiratory navigator signal is also called "pencil beam". The respiratory navigator signal monitors the diaphragm of the subject of interest 120 in the feet-head direction to identify breathing movement by movement of the diaphragm. When the respiratory navigator signal is stable, it is assumed that the subject of interest 120 has stopped breathing, i.e. performs breath-hold. The respiratory navigator signal is monitored with means of the MR imaging system 110 without hardware modifications.

According to a second embodiment, in step S120 multiple k-space 154 navigators are defined. Motion detection in the thorax 144 of the subject of interest 120 is performed by monitoring of k-space 154 navigator data. The k-space 154 navigators in this embodiment are arranged circular around a center 150 of the k-space 154. The k-space 154 navigators are interleaved with the acquisition of k-space 154 samples of the first subset of k-space 154 samples and use in this embodiment orbital navigators (O-NAV) and a dissimilarity matrix to check for the k-space 154 consistency of the collected data. The k-space 154 navigators are implemented as an interleaving k-space 154 data acquisition step, which is performed in addition to the acquisition of k-space 154 samples of the first subset of k-space 154 samples. The k-space 154 navigators are equidistantly interleaved with a series of multiple k-space 154 acquisitions, i.e. the acquisition of multiple k-space 154 samples, which is grouped in a segment of spin echo (TSE) or gradient echo (TFE) readouts or shots. The k-space 154 navigators are monitored with means of the MR imaging system 110 without hardware modifications.

According to a third embodiment, in step S120 motion detection comprises repeatedly processing the k-space 154 samples of the first subset of k-space 154 samples to obtain images of the thorax 144 of the subject of interest 120. Motion detection of the thorax 144 is performed from the acquired images. Known techniques for detection of motion in images can be used. The motion detection based on the obtained images is performed with means of the MR imaging system 110 without hardware modifications.

According to a fourth embodiment, in step S120 motion detection of the thorax 144 of the subject of interest 120 is performed by generation of k-space 154 samples based on the first subset of k-space 154 samples, and evaluating consistency of the generated samples and corresponding acquired samples within the k-space 154. Generation of k-space 154 is performed based the COCOA approach (Data Convolution and Combination Operation (COCOA) for Motion Ghost Artifacts Reduction). In this embodiment, samples from a k-space 154 kernel area are used for generation of k-space 154 samples. Based on the acquired k-space 154 samples, neighboring k-space 154 samples are estimated. If the deviation between subsequent k-space 154 samples including the generated k-space 154 samples is bigger than a threshold value, this is an indicator for motion, i.e. the subject of interest 120 is breathing. The motion detection based on k-space 154 generation is performed with means of the MR imaging system 110 without hardware modifications.

For the above described first to forth embodiments, in step S150 motion detection is performed accordingly. Differences e.g. due to the different subset of k-space 154 samples, which are acquired, are handled accordingly.

According to a fifth embodiment, a respiratory belt 142 is provided as motion detection device for monitoring motion of the subject of interest 120 in the thorax 144. The respiratory belt 142 is a pneumatic respiratory belt, which is put around the thorax 144 of the subject of interest 120, and provides pressure signals indicating movement of the thorax 144 of the subject of interest 120. The respiratory belt 142 is connected to control unit 126 of the MR imaging system 110, and the control unit 126 is adapted to perform the method for MR image generation using motion detection performed using the respiratory belt 142. Accordingly, in step S120 motion detection is performed using the motion detection device 142.

In one embodiment, a computer-readable medium such as a storage device, a floppy disk, compact disc, CD, digital versatile disc, DVD, Blu-ray disc, or a random access memory, RAM, is provided that contains a set of instructions that causes the control unit 126 of the MR imaging system to perform the above method.

Accordingly, a computer program product comprising a computer-usable medium including computer-usable program code is provided, wherein the computer-usable program code is adapted to execute the above method.

In a further embodiment a software package is provided for upgrading a MR imaging system 110, whereby the software package contains instructions for controlling the MR imaging system 10 to perform the above method.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST 110 magnetic resonance (MR) imaging system
112 magnetic resonance (MR) scanner
114 main magnet
116 RF examination space
118 center axis
120 subject of interest
122 magnetic gradient coil system
124 RF screen
126 MR imaging system control unit
128 monitor unit
130 MR image reconstruction unit
132 control line
134 RF transmitter unit
136 RF switching unit
138 control line
140 radio frequency (RF) antenna device
142 respiratory belt, motion detection device
144 thorax, area of the subject of interest
150 central k-space
152 outer k-space, peripheral k-space
154 k-space

The invention claimed is:

1. A method for magnetic resonance (MR) imaging of an area of a subject of interest, comprising
    issuing a breath-hold command to the subject of interest,
    performing motion detection of the subject of interest to detect a breath-hold condition in an area of the subject of interest,
    performing k-space sampling of the area of the subject of interest to acquire a first subset of k-space samples from the set of k-space samples covering the area of the subject of interest prior to detection of the breath-hold condition in the area of the subject of interest, wherein the first subset includes k-space samples acquired adjacent a periphery of k-space before the patient is in the breath-hold condition and k-space samples acquired in the peripheral portion of k-space after the breath-hold condition, and wherein the first subset covers less that all of k-space,
    upon detection of the breath-hold condition in the area of the subject of interest, performing k-space sampling of the area of the subject of interest with a given resolution, comprising performing k-space sampling to acquire a second subset of k-space samples covering the area of the subject of interest, wherein the second subset covers a central portion of k-space but does not cover all of k-space,
    processing the k-space samples covering the area of the subject of interest to obtain a MR image of the area of the subject of interest comprising processing the first and second subset of k-space samples to obtain the MR image of the area of the subject of interest,
    wherein the first and the second subset of k-space samples together cover the area of the subject of interest with the given resolution, and
    the step of performing motion detection of the subject of interest to detect a breath-hold condition in the area of the subject of interest is performed at least partially during the acquisition of the first and/or second subset of k-space samples,
    wherein the step of processing the k-space samples covering the area of the subject of interest to obtain a MR image of the area of the subject of interest further comprises rejecting and/or weighing k-space samples from the first and/or the second subset of k-space samples depending on the detected motion of the area of the subject of interest.

2. The method for magnetic resonance imaging according to claim 1, wherein processing the k-space samples covering the area of the subject of interest includes reconstructing the samples into the magnetic resonance image of the area of the subject of interest and further including:
    controlling a display device to display the MR image.

3. The method for magnetic resonance imaging according to claim 2, wherein the step of performing k-space sampling of the area of the subject of interest to acquire the first subset of k-space samples from the set k-space samples covering the area of the subject of interest with a given resolution comprises performing repetitive k-space sampling of the first subset of k-space samples.

4. The method for magnetic resonance imaging according to claim 2, wherein the step of performing k-space sampling of the area of the subject of interest to acquire a first subset of k-space samples comprises performing k-space sampling starting in a periphery of the k-space and extending k-space sampling to a center of the k-space.

5. The method for magnetic resonance imaging according to claim 2, wherein the step of performing k-space sampling to acquire a second subset of k-space samples covering the area of the subject of interest comprises performing k-space sampling starting in a center of the k-space and extending k-space sampling to a periphery of the k-space.

6. The method for magnetic resonance imaging according to claim 2, wherein the step of performing motion detection of the subject of interest to detect a breath-hold condition in the area of the subject of interest comprises:
performing generation of k-space samples based on the first subset of k-space samples, and
evaluating consistency of the generated samples and corresponding acquired samples within the k-space.

7. The method for magnetic resonance imaging according to claim 2, further comprising:
providing a motion detection device for monitoring motion of the subject of interest in the area of the subject of interest, wherein the step of performing motion detection of the subject of interest to detect a breath-hold condition in the area of the subject of interest comprises performing breath-hold detection using the motion detection device.

8. The method for magnetic resonance imaging according to claim 2, wherein the step of performing motion detection of the subject of interest to detect a breath-hold condition in the area of the subject of interest comprises monitoring motion in the area of the of the subject of interest to detect convergence to the breath-hold condition.

9. The method for magnetic resonance imaging according to preceding claim 8, wherein the step of monitoring motion in the area of the of the subject of interest to detect convergence to the breath-hold condition comprises monitoring a velocity of motion in the area of the of the subject of interest, and the step of detection of the breath-hold condition in the area of the subject of interest comprises detection of the breath-hold condition as detection of the velocity of motion in the area of the of the subject of interest being close to zero with a margin.

10. The method for magnetic resonance imaging according to claim 2, further comprising
adapting a sampling strategy for performing the k-space sampling of the area of the subject of interest depending on the motion detection and/or convergence of the breath-hold condition of the subject of interest.

11. The method for magnetic resonance imaging according to claim 2, wherein the step of performing k-space sampling of the area of the subject of interest comprises performing k-space sampling with a distributed sampling scheme, and
the step of processing the acquired k-space samples comprises reconstruction of holes in the k-space based on the acquired k-space samples based on the distributed sampling scheme.

12. A non-transitory computer-readable medium carrying computer software instructions for controlling one or more processors of an MR imaging system to control the MR imaging system according to the method of claim 2.

13. A magnetic resonance (MR) imaging system for providing an image representation of an area of a subject of interest positioned in an examination space of the MR imaging system, wherein the MR imaging system is adapted to perform the method for magnetic resonance imaging according to claim 2.

14. The method for magnetic resonance imaging according to claim 2, wherein the step of performing k-space sampling to acquire a second subset of k-space samples covering the area of the subject of interest comprises re-acquiring k-space samples from the first and/or the second subset of k-space samples depending on the detected motion of the area of the subject of interest.

15. A magnetic resonance (MR) imaging system comprising:
a main magnet configured to generate a main $B_0$ field through an examination space;
gradient magnetic field coils configured to generate magnetic field gradients across the examination space;
at least one radiofrequency (RF) coil configured to excite magnetic resonance and receive magnetic resonance signals from the examination space;
a display monitor; and,
one or more processors configured to:
receive motion information indicative of respiratory motion of an area of interest of the subject disposed in the examination space and determine when the area of interest is in a breath-hold condition,
control the gradient and RF coils to acquire a first subset of k-space samples of a full set of k-space samples covering the area of interest, the first subset of k-space samples being acquired starting before the subject is in the breath-hold condition and continuing until after the subject is in the breath-hold condition, wherein the first subset includes k-space samples acquired adjacent a periphery of k-space before the patient is in the breath-hold condition and k-space samples acquired in the peripheral portion of k-space after the breath-hold condition, and wherein the first subset covers less that all of k-space,
after acquiring the first subset of k-space samples and after the subject is in the breath-hold condition, acquire a second subset of k-space samples covering the area of interest, the first and second subsets of k-space data taken together sample the area of interest with a preselected resolution, wherein the second subset covers a central portion of k-space but does not cover all of k-space,
reject and/or weight k-space samples of the first and second subsets of k-space samples based on the received motion information, indicates respiratory motion in the area of interest,
reacquire rejected k-space samples based on the motion information,
reconstruct the first and second subsets into an MR image of the area of interest, and
control the display device to display the reconstructed MR image.

16. A magnetic resonance (MR) imaging system comprising:
a main magnet configured to generate a main $B_0$ field through an examination space;
gradient magnetic field coils configured to generate magnetic field gradients across the examination space;

at least one radiofrequency (RF) coil configured to excite magnetic resonance and receive magnetic resonance signals from the examination space;

a display monitor; and, one or more processors configured to:
  receive motion information indicative of respiratory motion of an area of interest of the subject disposed in the examination space and determine when the area of interest is in a breath-hold condition,
  control the gradient and RF coils to acquire a first subset of k-space samples starting before the subject is in the breath-hold condition and continuing until after the subject is in the breath-hold condition, wherein the first subset of k-space samples is acquired starting at a periphery of k-space and moving toward a center of k-space, wherein the first subset includes k-space samples acquired adjacent a periphery of k-space before the patient is in the breath-hold condition and k-space samples acquired in the peripheral portion of k-space after the breath-hold condition, and wherein the first subset covers less that all of k-space,
  after acquiring the first subset of k-space samples and after the subject is in the breath-hold condition, acquire a second subset of k-space samples, wherein the second subset covers less than all of k-space, wherein the first and second subsets of k-space data taken together sample the area of interest with a preselected resolution, and wherein the second subset of k-space samples is acquired starting at the center of k-space and working toward the periphery of k-space such that the samples nearest the center of k-space are acquired during the breath-hold condition,
  reconstruct the first and second subsets of k-space data together into an MR image of the area of interest, and
  control the display device to display the reconstructed MR image.

17. The MR imaging system according to claim 15, wherein determining the breath-hold condition includes evaluating consistency of the k-space samples of the first subset of k-space samples.

18. The MR imaging system according to claim 15, wherein the one or more processors are further configured to:
  control the gradient and MR coils to generate and receive magnetic resonance navigator signals; and
  evaluate the navigator signals to determine the motion information.

19. The MR imaging system according to claim 15, wherein the motion information indicates velocity in the area of interest and determining the breath-hold condition includes detecting the velocity approaching within a preselected margin of zero.

20. The MR imaging system according to claim 16, wherein the first and second subsets each include k-space data from both the center of k-space and the periphery of k-space.

* * * * *